(12) United States Patent
Feenstra et al.

(10) Patent No.: US 10,840,429 B2
(45) Date of Patent: Nov. 17, 2020

(54) PROCESS FOR THE PRODUCTION OF HIGH TEMPERATURE SUPERCONDUCTOR WIRES

(71) Applicant: BASF SE, Ludwigshafen (DE)

(72) Inventors: Ron Feenstra, Bonn (DE); Mario Sadewasser, Cologne (DE); Michael Baecker, Cologne (DE)

(73) Assignee: BASF SE, Ludwigshafen (DE)

( * ) Notice: Subject to any disclaimer, the term of this patent is extended or adjusted under 35 U.S.C. 154(b) by 521 days.

(21) Appl. No.: 15/560,826

(22) PCT Filed: Mar. 16, 2016

(86) PCT No.: PCT/EP2016/055630
§ 371 (c)(1),
(2) Date: Sep. 22, 2017

(87) PCT Pub. No.: WO2016/150781
PCT Pub. Date: Sep. 29, 2016

(65) Prior Publication Data
US 2018/0114892 A1    Apr. 26, 2018

(30) Foreign Application Priority Data
Mar. 26, 2015 (EP) .................... 15161129

(51) Int. Cl.
*H01L 39/24* (2006.01)
(52) U.S. Cl.
CPC ...... *H01L 39/2425* (2013.01); *H01L 39/2438* (2013.01); *H01L 39/2451* (2013.01); *H01L 39/2432* (2013.01); *H01L 39/2435* (2013.01)

(58) Field of Classification Search
None
See application file for complete search history.

(56) References Cited

U.S. PATENT DOCUMENTS

| 4,962,088 A | 10/1990 | Micheli et al. |
| 6,562,761 B1 | 5/2003 | Fritzemeier et al. |
| 2008/0153709 A1 | 6/2008 | Rupich et al. |
| 2011/0160066 A1 | 6/2011 | Aytug et al. |

FOREIGN PATENT DOCUMENTS

| EP | 0 830 218 A1 | 3/1998 |
| EP | 1 198 846 A2 | 4/2002 |
| EP | 1 208 244 B1 | 5/2004 |

(Continued)

OTHER PUBLICATIONS

Extended European Search Report dated Oct. 2, 2015 in Patent Application No. 15161129.0.

(Continued)

*Primary Examiner* — Colleen P Dunn
(74) *Attorney, Agent, or Firm* — Oblon, McClelland, Maier & Neustadt, L.L.P.

(57) ABSTRACT

The present invention is in the field of processes for the production of high temperature super-conductor wires. In particular, the present invention relates to a process for the production of high temperature superconductor wires comprising heating a film comprising yttrium or a rare earth metal, an alkaline earth metal, and a transition metal to a temperature of at least 700° C. and cooling the film to a temperature below 300° C., wherein the heating and cooling is per-formed at least twice.

11 Claims, 2 Drawing Sheets

(56) References Cited

FOREIGN PATENT DOCUMENTS

| EP | 2 137 330 A2 | 12/2009 |
|---|---|---|
| JP | 2012-204189 A | 10/2012 |
| WO | WO 2008/100281 A2 | 8/2008 |

OTHER PUBLICATIONS

International Search Report and Written Opinion dated Jun. 3, 2016 in PCT/EP2016/055630.
Ron Feenstra, et al. "A Modular Ex Situ Conversion Process for Thick MOD-Fluoride RBCO Precursors", IEEE Transactions on Applied Superconductivity, vol. 19, No. 3, 2009. pp. 3131-3135.

PROCESS FOR THE PRODUCTION OF HIGH TEMPERATURE SUPERCONDUCTOR WIRES

The present invention is in the field of processes for the production of high temperature superconductor wires.

High-temperature superconducting (HTS) films are promising for the use in for example electric motors, electronics, cables. Thick (i.e. >1 µm) HTS films, having a high critical current ($I_c$), are preferred in applications requiring high current carrying capability, e.g., power transmission and distribution lines, transformers, fault current limiters, magnets, motors, and generators. For industrial production it is necessary to provide processes with which high performance superconducting tapes can be produced at high volumetric speed. Such processes include heating process steps which impact the performance of the superconductor. Heating process steps are known from prior art.

R. Feenstra et al. describe a heating process for laboratory scale manufacturing of superconducting wire in IEEE Transactions on Applied Superconductors volume 19 (2009) page 3131-3135. The process consists of multiple processing steps which are performed at various temperatures in variable gas ambient as a function of time. However, in order to obtain a high quality superconductor, the atmosphere in the furnace has to be carefully adjusted for every zone of the furnace individually.

US 2011/160066 and WO 2008/100281 disclose a post-anneal processes without water in the vapor phase. However, the superconductor layer is already fully formed during the first annealing step, such that the post-annealing has a minor effect on the superconductor layer.

It was an object of the present invention to provide a process for producing high temperature superconductor wires yielding a product of high performance and reliable quality on a large scale. It was aimed at a process which does not require sophisticated adjustment of the atmosphere in different zones of the furnace, making it possible to employ low-cost furnace systems. The process should further be flexible and easily adaptable to different types of superconductor wire.

These objects were generally achieved by a process for the production of high temperature superconductor wires comprising heating a film comprising yttrium or a rare earth metal, an alkaline earth metal, and a transition metal to a temperature of at least 700° C. and cooling the film to a temperature below 300° C., wherein the heating and cooling is performed at least twice.

In particular, these objects were achieved by a process for the production of high temperature superconductor wires comprising heating a film comprising yttrium or a rare earth metal, an alkaline earth metal, and a transition metal to a temperature of at least 700° C. and cooling the film to a temperature below 300° C., wherein the heating and cooling is performed at least twice and the partial pressure of water during the first heating to a temperature of at least 700° C., denoted $P_{1,w}$, the total pressure during the first heating to a temperature of at least 700° C., denoted $P_1$, the partial pressure of water during the second heating to a temperature of at least 700° C., denoted $P_{2,w}$, and the total pressure during the second heating to a temperature of at least 700° C., denoted $P_2$, fulfill the relationship $$\frac{\sqrt{P_{1,w}}}{P_1} < \frac{\sqrt{P_{2,w}}}{P_2}$$

when $P_{1,w}$, $P_1$, $P_{2,w}$ and $P_2$ are expressed in mbar.

Preferred embodiments of the present invention can be found in the description and the claims. Combinations of different embodiments fall within the scope of the present invention.

The film according to the present invention can be prepared by various methods such as chemical vapor deposition, evaporation, sputtering, or chemical solution deposition. Chemical solution deposition is preferable as it allows high production speed at relatively low cost.

In order to make the film by chemical solution deposition a solution comprising an yttrium- or rare earth metal-containing compound, an alkaline earth metal-containing compound and a transition metal-containing compound are deposited on a substrate. Such compounds include oxides, hydroxides, halogenides, carboxylates, alkoxylates, nitrates or sulfates. Carboxylates are preferred, in particular acetate or propionate. Carboxylates and alkoxylates can be substituted, preferably by fluorine, such as difluoroacetate, trifluoroacetate, or partially or fully fluorinated propionate.

When using chemical solution deposition, at least one of the yttrium- or rare earth metal-containing compound, the alkaline earth metal containing compound or the transition metal containing compound contains fluorine. Preferably, the alkaline earth metal containing compound contains fluorine, for example as trifluoroacetate.

Preferably, the yttrium or rare earth metal is yttrium, dysprosium, holmium, erbium, gadolinium, europium, samarium, neodymium, praseodymium, or lanthanum, in particular yttrium. It is also possible to use more than one of yttrium or rare earth metal, for example yttrium and gadolinium. Preferably, the alkaline earth metal is barium. Preferably, the transition metal is copper.

The solution can contain further elements, preferably as soluble compound. These elements can be for example calcium, iron or cobalt. Sometimes, these elements replace parts of one or more of the yttrium- or rare earth metal, the alkaline earth metal or the transition metal in the high temperature superconductor.

The solution contains the yttrium- or rare earth metal-containing compound, the alkaline earth metal containing compound and the transition metal containing compound in a molar ratio deemed optimal for the superconductor growth and/or properties, taking into consideration the molar composition of the respective metals in the superconductor to be produced. Their concentration thus depends on the superconductor to be produced. Generally, their concentration in the solution is independent of each other 0.01 to 10 mol/l, preferably 0.1 to 1 mol/l.

The solution preferably contains a solvent, for example water, acetonitrile, tetrahydrofuran, 1-methyl-2-pyrrolidinone, pyridine or alcohols, such as methanol, ethanol, 2-methoxyethanol, isopropanol, butanol, pentanol, or higher alcohols such as $C_6$-$C_{12}$ alcohols, or mixtures of thereof. Alcohols are preferred, in particular methanol.

The precursor solution may contain stabilizers, wetting agents and/or other additives. The amount of these components may vary in the range of 0 up to 30 weight % relating to the total weight of the dry compounds used. Additives might be needed for adjusting the viscosity. Additives include Lewis bases; amines such as TEA (triethanolamine), DEA (diethanolamine); surfactant; polycarboxylic acids such as PMAA (polymetacrylic acid) and PAA (polyacrylic acid), PVP (polyvinylpyrolidone), ethylcellulose.

Preferably the solution is heated and/or stirred prior to being deposited on the substrate, such as to reflux. In addition, the solution can further contain various additives to increase the stability of the solution and facilitate the deposition process. Examples for such additives include wetting agents, gelling agents, and antioxidants.

The deposition of the solution can be carried out in various ways. The solution can be applied for example by dip-coating (dipping of the substrate into the solution), spin-coating (applying the solution to a rotating substrate), spray-coating (spraying or atomizing the solution on the substrate), capillary coating (applying the solution via a capillary), slot die coating (applying the solution through a narrow slit), and ink-jet printing. Slot die coating and ink-jet printing are preferred.

Preferably, the solution is evaporated after deposition at a temperature below the boiling point of the solvent, such as 10 to 100° C. below the boiling point of the solvent, preferably 20 to 50° C. below the boiling point of the solvent.

Preferably, the molar ratio of the transition metal and the yttrium or rare earth metal in the film is 3:0.7 to 3:2, more preferably 3:1.0 to 3:1.5, in particular 3:1.2 to 3:1.4. Preferably, the molar ratio of the transition metal and the alkaline earth metal deposited on the substrate is 3:1 to 3:2.5, more preferably 3:1.5 to 3:2.0, in particular 3:1.7 to 3:1.9.

Preferably, the film further contains substances capable of forming pinning centers. Pinning centers typically increase the critical current density and/or the critical magnetic flux density of the superconductor. Substances capable of forming pinning centers include soluble metal salts, excess metal in the precursor solution, or nanoparticles. In case of nanoparticles the solution is a suspension. Examples for materials making up pinning centers include $ZrO_2$, stabilized $ZrO_2$, $HfO_2$, $BaZrO_3$, $Ln_2Zr_2O_7$, $CeO_2$, $BaCeO_3$, $Y_2O_3$ or $RE_2O_3$, in which RE stand for one or more rare earth metals.

The film is usually on a substrate. The substrate may be formed of any material capable of supporting buffer and/or superconducting layers. For example suitable substrates are disclosed in EP 830 218, EP 1 208 244, EP 1 198 846, EP 2 137 330. Often, the substrate is a metal and/or alloy strip/tape, whereby the metal and/or alloy may be nickel, silver, copper, zinc, aluminum, iron, chromium, vanadium, palladium, molybdenum, tungsten and/or their alloys. Preferably the substrate is nickel based. More preferably, the substrate is nickel based and contains 1 to 10 at-%, in particular 3 to 9 at-%, tungsten. Laminated metal tapes, tapes coated with a second metal like galvanic coating or any other multi-material tape with a suitable surface can also be used as substrate.

The substrate is preferably textured, i.e. it has a textured surface. The substrates are typically 20 to 200 µm thick, preferably 40 to 100 µm. The length is typically greater than 1 m, for example 100 m, the width is typically between 1 cm and 1 m.

Preferably the substrate surface is planarized before the film comprising yttrium or a rare earth metal, an alkaline earth metal and a transition metal is deposited onto it, for example by electropolishing. It is often advantageous to subject the thus planarized substrate to a thermal treatment. This thermal treatment includes heating the substrate to 600 to 1000° C. for 2 to 15 minutes, wherein the time refers to the time during which the substrate is at the maximum temperature. Preferably, the thermal treatment is done under reducing atmosphere such as a hydrogen-containing atmosphere. The planarization and/or thermal treatment may be repeated.

Preferably, the surface of the substrate has a roughness with rms according to DIN EN ISO 4287 and 4288 of less than 15 nm. The roughness refers to an area of 10×10 µm within the boundaries of a crystallite grain of the substrate surface, so that the grain boundaries of the metal substrate do not influence the specified roughness measurement.

Preferably, between the substrate and the film there are one or more buffer layers. The buffer layer can contain any material capable of supporting the superconductor layer. Examples of buffer layer materials include metals and metal oxides, such as silver, nickel, $TbO_x$, $GaO_x$, $CeO_2$, yttria-stabilized zirconia (YSZ), $Y_2O_3$, $LaAlO_3$, $SrTiO_3$, $Gd_2O_3$, $LaNiO_3$, $LaCuO_3$, $SrRuO_3$, $NdGaO_3$, $NdAlO_3$ and/or some nitrides as known to those skilled in the art. Preferred buffer layer materials are yttrium-stabilized zirconium oxide (YSZ); various zirconates, such as gadolinium zirconate, lanthanum zirconate; titanates, such as strontium titanate; and simple oxides, such as cerium oxide, or magnesium oxide. More preferably the buffer layer contains lanthanum zirconate, cerium oxide, yttrium oxide, strontium titanate and/or rare-earth-metal-doped cerium oxide such as gadolinium-doped cerium oxide. Even more preferably the buffer layer contains lanthanum zirconate and/or cerium oxide.

To enhance the degree of texture transfer and the efficiency as diffusion barrier, multiple buffer layers each containing a different buffer material are between the substrate and the film. Preferably the substrate includes two or three buffer layers, for example a first buffer layer comprising lanthanum zirconate and a second buffer layer containing cerium oxide.

If the film comprising yttrium or a rare earth metal, an alkaline earth metal and a transition metal is made by chemical solution deposition, it is preferable to remove remaining organic parts of the precursors before heating the film to a temperature of at least 700° C. This is typically done by heating the film to a temperature $T_p$ of 300 to 600° C., preferably 350 to 450° C. The film is preferably kept within this temperature range for 1 to 30 min, preferably 5 to 15 min. It is possible to cool the film down before heating it to a temperature of at least 700° C. or to heat it directly to a temperature of at least 700° C.

According to the present invention the film is heated to a temperature of at least 700° C., preferably at least 720° C., in particular at least 740° C. Normally, the temperature does not exceed 900° C.

According to the present invention the film is heated to a temperature of at least 700° C. and cooled to a temperature below 300° C., wherein the heating and cooling is performed at least twice. Usually, seed crystals of the high temperature superconductor develop in the film during the first time heating to a temperature of at least 700° C. while most of the film constitutes different phases. After the second heating to a temperature of at least 700° C., the yttrium or a rare earth metal, the alkaline earth metal, and the transition metal are fully converted into a high temperature superconductor in crystalline form. Fully converted in the context of the present invention means at least 90%, preferably at least 95%, in particular at least 98%, such as at least 99%. Preferably, the film is heated to a temperature of at least 700° C. and cooled to a temperature below 300° C. for a first time such that seed crystals of the high temperature superconductor develop in the film during the first time heating to a temperature of at least 700° C. while most of the film constitutes different phases, more preferably at least 70% of the film constitutes different phases, in particular at least 90% of the film constitutes different phases. This can be achieved by choosing the water vapor pressure and the heating time sufficiently low. The composition of the film is preferably determined by X-ray scattering.

Preferably, the first time heating to a temperature of at least 700° C. contains at least one temperature plateau and the second heating to a temperature of at least 700° C. contains at least one temperature plateau. A temperature plateau in the context of the present invention is a period in which the temperature changes at a rate of less than 1000° C./h, preferably less than 500° C./h, in particular less than 300° C./h, such as less than 200° C./h. The time-average temperature of the longest temperature plateau during the first heating to a temperature of at least 700° C. is denoted $T_I$ and the time-average temperature of the longest temperature plateau during the second heating to a temperature of at least 700° C. is denoted $T_{II}$.

FIG. 1 shows an example of such a temperature profile. The temperature is first quickly increased to at least 700° C. where it reaches the plateau (I) with the temperature $T_I$, is then quickly reduced to below 300° C., then quickly increased to at least 700° C. where it reaches the plateau (II) with the temperature $T_{II}$ and is again quickly reduced to below 300° C. Preferably, $T_I$ is lower than $T_{II}$, $T_I$ is for example 5 to 80° C. lower than $T_{II}$, in particular 10 to 60° C. lower, such as 20 to 50° C. lower.

The heating rate outside a temperature plateau is typically 1000 to 100 000° C./h, preferably 5000 to 50 000° C./h. Preferably, during the first time heating to a temperature of at least 700° C. the heating rate is reduced once the film has reached a temperature of 300 to 600° C., preferably 400 to 500° C. to 10 to 90% of the initial heating rate, preferably to 30 to 70% of the initial heating rate.

Upon heating the film comprising yttrium or a rare earth metal, an alkaline earth metal and a transition metal to a temperature of at least 700° C. and cooling to a temperature below 300° C., the film is kept at or above 700° C. for a period of 30 s to 20 min, preferably 1 to 10 min.

Preferably, the first heating to a temperature of at least 700° C. contains at least two temperature plateaus with temperatures of at least 700° C. wherein the temperature of the first temperature plateau, denoted $T_{I,1}$, is higher than the temperature of the second temperature plateau, denoted $T_{I,2}$, preferably 5 to 80° C. higher, more preferably 10 to 60° C. higher, in particular 20 to 50° C. higher. The first temperature plateau is shorter than the second temperature plateau, preferably the first plateau takes 1 to 50% of the time of the second plateau, more preferably 5 to 30%, in particular 15 to 25%. FIG. 2 shows a temperature profile for this case, wherein the first heating to at least 700° C. contains two temperature plateaus $I_1$ with the corresponding temperature $T_{I,1}$ and $I_2$ with the corresponding temperature $T_{I,2}$. It is thereby possible that $T_{I,1}$ is the same or higher than $T_{II}$ while $T_{I,2}$ is lower than $T_{II}$.

The pressure during heating to a temperature of at least 700° C. is preferably below 1 bar, for example 0.1 to 500 mbar, preferably 1 to 100 mbar, in particular 5 to 20 mbar.

The partial pressure of water during the first heating to a temperature of at least 700° C., denoted $P_{1,w}$, the total pressure during the first heating to a temperature of at least 700° C., denoted $P_1$, the partial pressure of water during the second heating to a temperature of at least 700° C., denoted $P_{2,w}$, and the total pressure during the second heating to a temperature of at least 700° C., denoted $P_2$, usually fulfill the relationship $$\frac{\sqrt{P_{1,w}}}{P_1} < \frac{\sqrt{P_{2,w}}}{P_2}$$

when $P_{1,w}$, $P_1$, $P_{2,w}$ and $P_2$ are expressed in mbar, preferably $$1.5 \cdot \frac{\sqrt{P_{1,w}}}{P_1} < \frac{\sqrt{P_{2,w}}}{P_2}$$

more preferably $$2 \cdot \frac{\sqrt{P_{1,w}}}{P_1} < \frac{\sqrt{P_{2,w}}}{P_2}$$

in particular $$2.5 \cdot \frac{\sqrt{P_{1,w}}}{P_1} < \frac{\sqrt{P_{2,w}}}{P_2}$$

The process according to the present invention further comprises cooling the film to a temperature below 300° C., preferably below 200° C., in particular below 100° C., such as room temperature. Normally, the film is not cooled to a temperature lower than 0° C. The cooling rate is typically 1000 to 100 000° C./h, preferably 5000 to 50 000° C./h.

The heating to at least 700° C. is preferably performed in a furnace in which only one particular pressure and one particular composition of the atmosphere can be chosen. It is either possible to use one such furnace and heat the film in this furnace at least twice or to use two or more such furnaces and heat the film consecutively in these. In any case, the film is given enough time to cool down in between each heating in a furnace to the temperature described above. Preferably, the film is passed through a furnace. More preferably, the film is passed through a furnace at a speed of 1 to 300 m/h, even more preferably 5 to 100 m/h, in particular 10 to 30 m/h.

In case the substrate is in the form of a long tape it is preferable to use a reel-to-reel system, i.e. provide the substrate on one reel, unreel it, let it pass through the furnace and reel it onto a second reel. When the complete tape has passed the furnace and is on the reel, this reel can be brought either to the next furnace, where it is unreeled and passes the furnace, or the tape is unreeled and passes through the first furnace again.

Preferably, after having been heated to 700° C. and cooled to below 300° C. at least twice the superconductor wire is coated with an inert metal layer, for example silver, gold, platinum or alloys containing at least one of these, preferably silver. This coating typically has a thickness of 100 nm to 5 μm, preferably 200 nm to 3 μm. The inert metal layer can be applied by pressing a metal film on the superconductor wire, by gas-phase processes such as sputtering, or by chemical solution deposition in which a metal salt or metal nanoparticles are deposited from solution and subsequently converted to the metal by heating.

Preferably, after having been heated to 700° C. and cooled to below 300° C. at least twice the superconductor wire is heated to 200 to 600° C., preferably 400 to 500° C. in an atmosphere in which the partial pressure of oxygen is 70 to 100%, preferably 90 to 100% of the total pressure of the atmosphere. A typical pressure for this heating step is 800 mbar to 2000 mbar, preferably 1000 to 1200 mbar, such as ambient pressure. This heating typically takes 20 s to 200 min, preferably 5 to 20 min.

A preferred process thus comprises
(a) providing a textured substrate with one or more than one buffer layers,
(b) deposition a solution comprising an yttrium- or rare earth metal-containing compound, an alkaline earth metal-containing compound and a transition metal-containing compound are deposited on the substrate,
(c) drying the deposited solution, thereby forming a film comprising yttrium or a rare earth metal, an alkaline earth metal and a transition metal,
(d) heating the film 300 to 600° C., and
(e) heating the film to a temperature of at least 700° C. and cooling the film to a temperature below 300° C., wherein heating and cooling is performed at least twice.

Often, the superconductor wire is cut into narrower bands and stabilized by coating with a conductive metal such as copper for example by electrodeposition.

EXAMPLES

The examples show two-pass processes, applied to CSD precursors with cation stoichiometry $Y_{1.3}Ba_{1.8}Cu_3$. Layers with a final thickness of about 1 µm were produced by the deposition of two successive 500 nm coatings. The solutions contained trifluoroacetate salts of at least one of the cationic constituents. Each coating was pyrolyzed to a maximum temperature of 400° C. according to standardized procedures. The total thickness after pyrolysis of the second layer was about 2.5-3 µm. Substrates consisted of a tape of textured Ni containing 5 at % W with a width of 1 cm coated with $La_2Zr_2O_7$ and $CeO_2$ buffer layers made by chemical solution deposition. This sample was passed through a first furnace by a reel-to-reel system and subsequently passed through a second furnace again by a reel-to-reel system. The tape motion and the gas flow were in opposite directions in both furnaces. The sample cooled to room temperature between the two heat treatments when being collected on the take-up reel. The tape speeds described in the examples below are based on a heating length of 1.5-2 m for both furnaces. Higher tape speeds can be achieved for example by using longer furnaces.

Example 1

Figure 1:
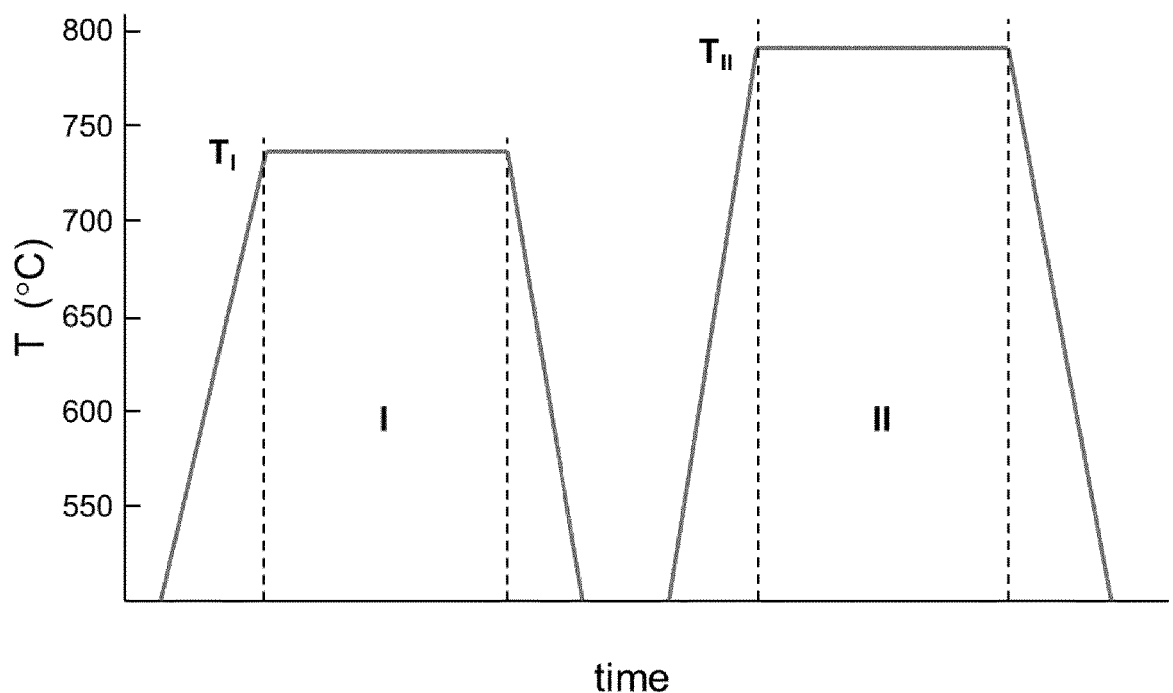
FIG. 1: Schematic temperature profile in which each heating to at least 700° C. contains one temperature plateau.
Figure 2:
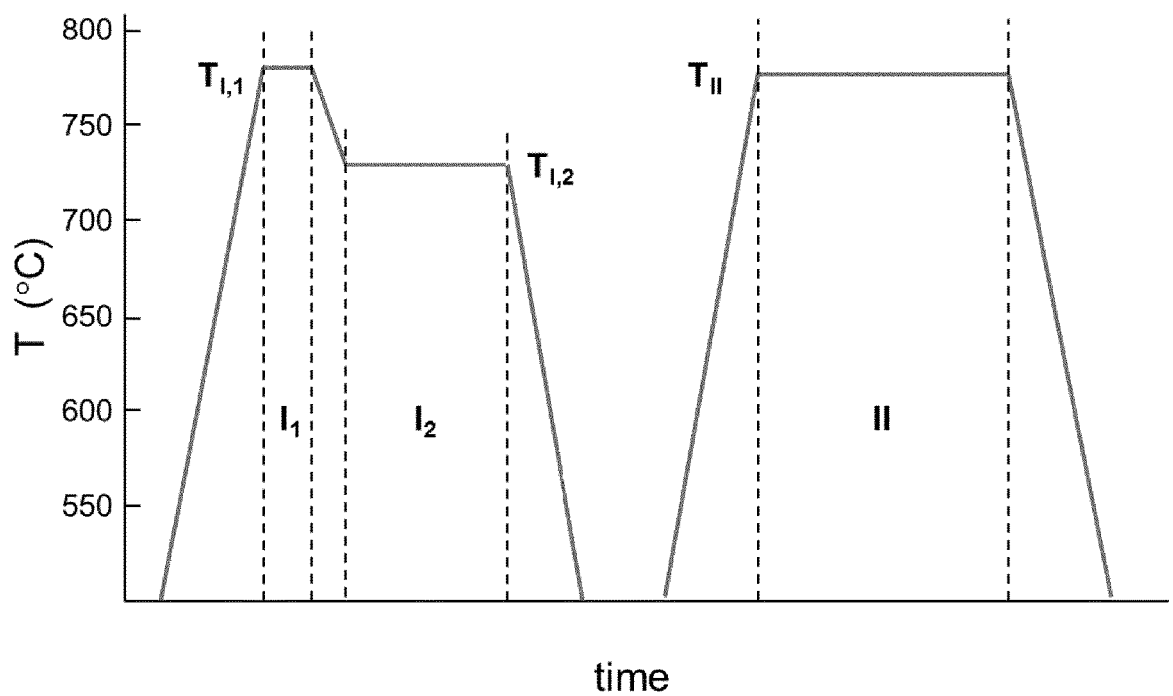
FIG. 2: Schematic temperature profile in which the first heating to at least 700° C. contains two temperature plateaus.
Figure 3:
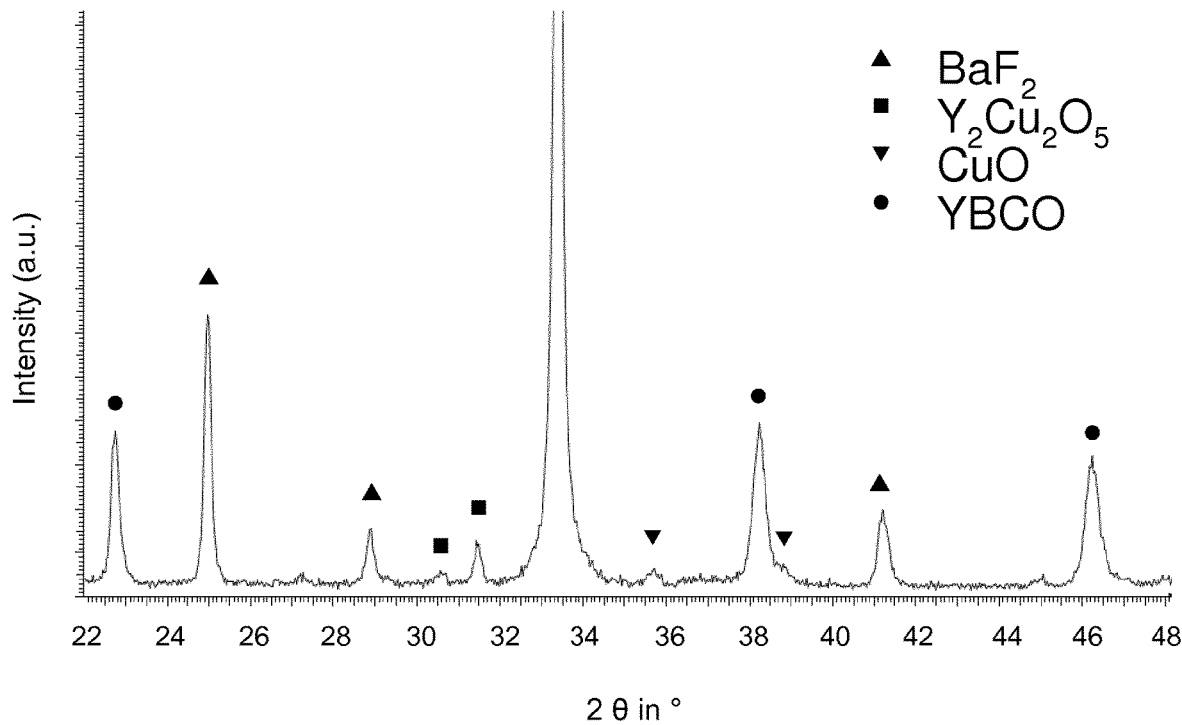
FIG. 3: X-ray diffraction pattern of the film of example 1 after passing through the first furnace. Diffraction peaks corresponding to different phases are indicated by different symbols, whereby YBCO stands for $YBa_2Cu_3O_{7-x}$. The large peak at $2\theta \cong 33\text{-}33.5°$ corresponds to a superposition of the $(400)La_2Zr_2O_7$ (LZO) and $(200)CeO_2$ buffer layer diffraction peaks.

The first furnace had a temperature of 750° C. In this furnace a mixture of water vapor, nitrogen and oxygen was flown over the sample at a total pressure of 10 mbar. The water flow rate was 40 g/h (which corresponds to a water partial pressure of 3.3 mbar) and the nitrogen flow rate was 100 l/h. The oxygen partial pressure was 0.2 mbar. The sample was moved through the furnace at a speed of 20 m/h corresponding to a high-temperature residence time of 5.5 min in the first furnace. The residence time includes a slower heating ramp from 500 to 700° C. during the initial heating, but excludes the fast part of the heating ramp to 500° C. and the cooling ramp. FIG. 3 shows an XRD spectrum of the sample after exiting from the first furnace.

The second furnace had a temperature of 780° C. A mixture of water vapor and oxygen was flown over the sample at a total pressure in the furnace of 1.5 mbar. The water flow rate was 100 g/h (corresponding to a water partial pressure of 1.3 mbar) and the oxygen flow rate was 20 l/h (corresponding to an oxygen partial pressure of 0.2 mbar). The sample was moved at 20 m/h resulting in a high-temperature residence time of 4.5 min in the second furnace (heating and cooling ramps not included).

Not taking into account YBCO seed crystals or nuclei formed during the first pass, a maximum growth rate of 3.7 nm/s may be estimated from the 4.5 min residence time of the second heat treatment and the target YBCO film thickness of 1 µm. A critical current $I_c$ value of 176 A was measured at 77 K over the full 1-cm tape width for a 1 m long sample with a continuous Hall sensor technique (Tapestar).

Example 2

The first furnace had two zones with different temperatures. The zone through which the sample passed first had a temperature $T_1$ of 775° C., the second zone had a temperature $T_2$ of 740° C. The residence time of the sample in the first zone was about 0.3 min and in the second zone 1.5 min. In the first furnace a mixture of water vapor, nitrogen and oxygen was flown over the sample at a total pressure of 10 mbar. The water flow rate was 160 g/h and the nitrogen flow rate was 100 l/h. The water partial pressure was 6.5 mbar, the oxygen partial pressure was 0.25 mbar. The sample was moved through the furnace at a speed of 20 m/h corresponding to a residence time of 5.5 min in the first furnace.

Passing through the second furnace was the same as described in example 1 for the second furnace.

Figure 4:
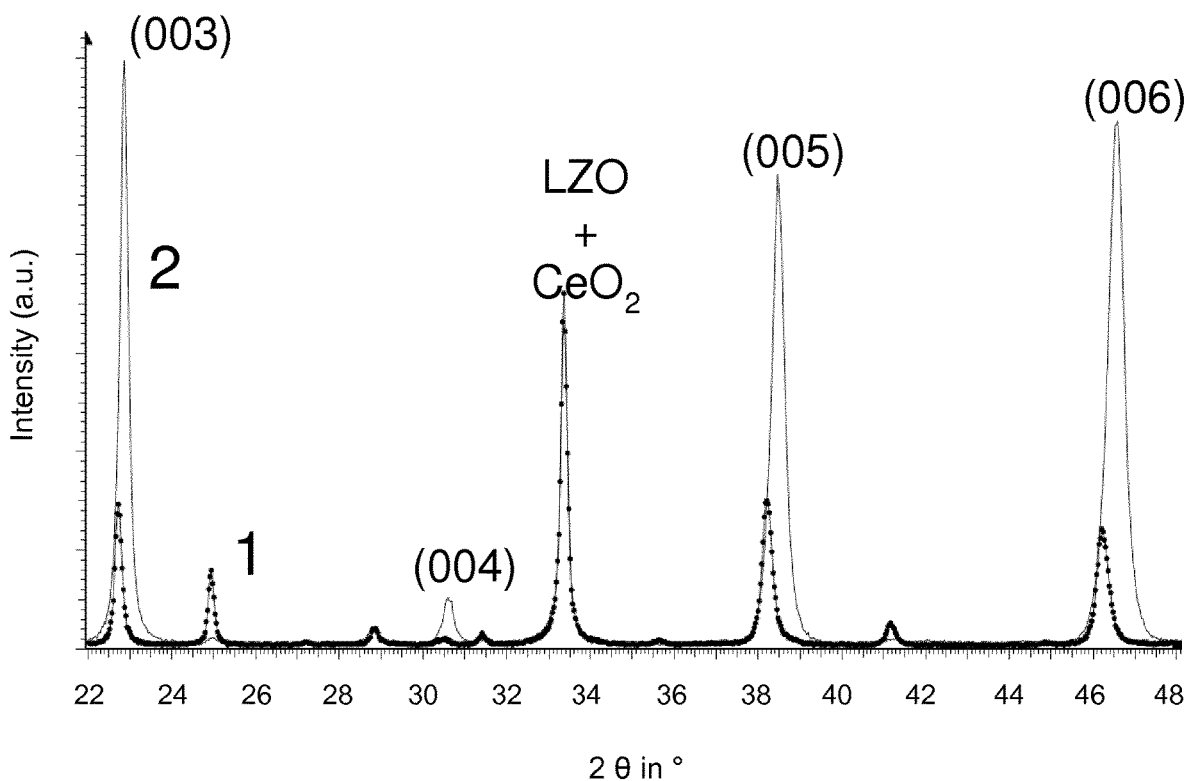
FIG. 4: X-ray diffraction peaks of the film of example 2 after passing through the first furnace (line with dots, denoted by 1) and second furnace (line without dots, denoted by 2), respectively. The film passed through the second furnace was subsequently oxidized in pristine oxygen at temperatures below 500° C. Diffraction peaks corresponding to $YBa_2Cu_3O_{7-x}$ are indicated by their (00L) values.

A critical current of 161 A was measured inductively for this sample over the full 1-cm tape width. Similar $I_c$ values were obtained from transport measurements on comparable samples. In FIG. 4 XRD spectra of the sample after exiting from the first furnace (curve 1—dotted) and after exiting from the second furnace (curve 2) are depicted. The XRD data of FIG. 4 indicate that the large majority of the YBCO is formed during the second pass.

The invention claimed is:

1. A process for producing high temperature superconductor wires, the process comprising
heating a film comprising yttrium or a rare earth metal, an alkaline earth metal, and a transition metal to a temperature of at least 700° C. and cooling the film to a temperature below 300° C.,
wherein the heating and cooling is performed at least twice and a partial pressure of water during a first heating to a temperature of at least 700° C., denoted $P_{1,w}$, a total pressure during the first heating to the temperature of at least 700° C., denoted $P_1$, a partial pressure of water during a second heating to a temperature of at least 700° C., denoted $P_{2,w}$, and a total pressure during the second heating to the temperature of at least 700° C., denoted $P_2$, fulfill the relationship:

$$\frac{\sqrt{P_{1,w}}}{P_1} < \frac{\sqrt{P_{2,w}}}{P_2}$$

when $P_{1,w}$, $P_1$, $P_{2,w}$ and $P_2$ are expressed in mbar.

2. The process according to claim 1, wherein the heating comprises developing seed crystals of the high temperature superconductor in the film during the first heating to the temperature of at least 700° C., thereby constituting at least 70% of the film different phases.

3. The process according to claim 1, wherein:
the first heating to the temperature of at least 700° C. includes at least one temperature plateau and the second heating to the temperature of at least 700° C. includes at least one temperature plateau;
the temperature plateau is a period of time in which a temperature changes at a rate of less than 1000° C./h, and
a time-average temperature of a longest temperature plateau during the first heating to the temperature of at least 700° C., denoted $T_1$, is lower than a time-average temperature of a longest temperature plateau during the second heating to the temperature of at least 700° C., denoted $T_H$.

4. The process according to claim 1, wherein:
the first heating to the temperature of at least 700° C. includes at least two temperature plateaus with temperatures of at least 700° C.;
each of the temperature plateaus is a period of time in which a temperature changes at a rate of less than 1000° C./h, and
a temperature of a first temperature plateau, denoted $T_{1,1}$, is higher than a temperature of a second temperature plateau, denoted $T_{1,2}$.

5. The process according to claim 1, wherein the film is passed through a furnace at a speed of 1 to 300 m/h.

6. The process according to claim 1, wherein the film is consecutively passed through different furnaces.

7. The process according to claim 1, wherein the film comprises yttrium, barium and copper.

8. The process according to claim 1, wherein a molar ratio of the transition metal and the yttrium or rare earth metal in the film is 3:1.0 to 3:1.5.

9. The process according to claim 1, wherein a molar ratio of the transition metal and the earth alkaline metal in the film is 3:1.5 to 3:2.0.

10. The process according to claim 1, wherein the film is on a substrate comprising Ni and 1-10 at-% tungsten.

11. The process according to claim 10, wherein between the substrate and the film there is a buffer layer comprising lanthanum zirconate, cerium oxide, or both.

* * * * *